United States Patent
Bungo

(10) Patent No.: US 8,101,873 B2
(45) Date of Patent: Jan. 24, 2012

(54) PROTECTIVE STRUCTURE FOR A CIRCUIT BOARD AND METHOD FOR FABRICATING THE SAME

(75) Inventor: Keiichiro Bungo, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 257 days.

(21) Appl. No.: 12/406,710

(22) Filed: Mar. 18, 2009

(65) Prior Publication Data

US 2009/0277682 A1 Nov. 12, 2009

(30) Foreign Application Priority Data

May 7, 2008 (JP) ................................ 2008-120908

(51) Int. Cl.
*H01L 23/28* (2006.01)
(52) U.S. Cl. ........................................ 174/523; 174/521
(58) Field of Classification Search .................. 174/521, 174/523; 257/787
See application file for complete search history.

(56) References Cited

U.S. PATENT DOCUMENTS

| | | | | |
|---|---|---|---|---|
| 5,610,799 | A * | 3/1997 | Kato ............................. | 361/752 |
| 6,583,355 | B2 * | 6/2003 | Skrzypchak .................. | 174/521 |
| 7,897,234 | B2 * | 3/2011 | Selverian et al. .............. | 428/76 |
| 2011/0114383 | A1 * | 5/2011 | Covers .......................... | 174/521 |

FOREIGN PATENT DOCUMENTS

| | | |
|---|---|---|
| JP | 59-190086 A | 10/1984 |
| JP | 2002-271002 A | 9/2002 |

* cited by examiner

*Primary Examiner* — Hung Ngo
(74) *Attorney, Agent, or Firm* — Arent Fox LLP

(57) ABSTRACT

In a protective structure for a circuit board (1) that includes a casing (3) for receiving the circuit board, the casing is provided with a recess (11) for receiving a large component part protruding from the circuit board therein, and potting material (6) is filled in a space defined between the large component part and a surrounding wall of the recess. Typically, the potting material is filled in a gap between the large component part and the surrounding wall of the recess without substantially extending out of the recess. Because the large component part is not only supported by the circuit board but also by the casing via the cured potting material, the stress acting on a connection part that connects the large component part to the circuit board is minimized, and this enhances the mechanical integrity of the circuit board assembly. Because the use of the potting material is limited to the recess, the required amount of the potting material can be minimized, and this means a lower material cost and a reduced weight. Reducing the amount of the potting material means a shorter period of time required for curing it, and this improves the production efficiency of the circuit board assembly. If the protection of the component parts from intrusion of moisture is desired, protective coating may be additionally applied to the circuit board.

5 Claims, 5 Drawing Sheets

PROTECTIVE STRUCTURE FOR A CIRCUIT BOARD AND METHOD FOR FABRICATING THE SAME

CROSS-REFERENCE TO RELATED APPLICATION

This application claims the priority of Japanese Application No. 2008-120908, filed May 7, 2008, the entire specification, claims and drawings of which are incorporated herewith by reference.

TECHNICAL FIELD

The present invention relates to an electronic assembly including an electronic circuit board, and in particular to a protective structure for a circuit board package.

BACKGROUND OF THE INVENTION

An electronic circuit is often packaged in a protective casing, and such an electronic circuit may include a ECU (electronic control unit) for controlling input and output devices for electronic circuits used in general-purpose engines and electric generators.

FIG. 1 shows a typical conventional ECU package. The ECU package 10 comprises a circuit board 1, electronic component parts 2 mounted on the circuit board 1, a casing 3 receiving the circuit board 1 therein and potting material 6 filled in the casing 3 to fixedly hold the circuit board 1 in the casing 3. See Japanese patent laid open publication (kokai) No. 59-190086 (Patent Document 1), for instance. The electronic component parts 2 include large component parts 2a such as transformers and capacitors, and small component parts 2b such as surface mounted component parts and small discrete component parts.

FIG. 2 shows how such a package 10 may be fabricated. First of all, the electronic component parts 2 are mounted on the circuit board 1 (ST21). The circuit board 1 is then placed in the casing 3, and provisionally secured at prescribed positions (ST22). This can be accomplished, for instance, by passing terminals 5 extending from connectors 4 insert molded in the casing 3 into corresponding holes 7 formed in the circuit board 1 for soldering (see FIG. 1). The potting material 6 is then poured into the casing 3 so as to entirely cover the electronic component parts as well as the circuit board 1 (ST23), and is allowed to be cure or solidify in this condition (ST24).

The potting material 6 protects the electronic component parts 2 from vibrations and moisture. When no potting material is used, the large component 2a is caused to oscillate owing to external vibrations, and the resulting inertia force may cause undue mechanical stresses to the soldered parts between the large component 2a and circuit board 1. When potting material 6 is used, the circuit board 2 and large component 2a are kept immobile relative to each other even in the presence of external vibrations, and this minimizes the mechanical stresses in the soldered parts that join the large component 2a to the circuit board 1.

Furthermore, the potting material 6 seals off the circuit board 1 and electronic component parts 2 from the intrusion of moisture, and this prevents any leakage of electric current.

Patent Document 1 proposes to minimize influences of external vibrations on electronic component parts mounted on a circuit board in an outboard marine engine by orienting the major plane of the circuit board supporting the electronic component parts along the direction of the movement of the vibrations.

Meanwhile, the use of potting material is desired to be minimized because of material cost and added weight. Japanese patent laid open publication (kokai) No. 200-271002 (Patent Document 2) proposes to use two separate circuit boards including a first circuit board using potting material for the protection of component parts mounted thereon and a second circuit board using only protective coating which is effective for protecting component parts from moisture.

According to the prior art disclosed in Patent Document 1, the mounting position or orientation of the electronic component package must be properly selected, and this imposes some restriction in design. In particular, in applications where mounting space is scarce, this restriction is highly disadvantageous.

According to the prior art disclosed in Patent Document 2, the component parts mounted on the second circuit board are not protected from external vibrations. Furthermore, using two separate circuit boards causes an increase in material and manufacturing costs, and requires a larger mounting space.

BRIEF SUMMARY OF THE INVENTION

In view of such problems of the prior art, a primary object of the present invention is to provide a protective structure for a protective structure for a circuit board which requires a minimum amount of potting material for the protection of a circuit board from external vibrations and intrusion of moisture.

A second object of the present invention is to provide a protective structure for a circuit board which allows a high level of freedom in design while affording a high level of protection against external vibrations and intrusion of moisture.

According to the present invention, such objects can be at least partly accomplished by providing a protective structure for a circuit board, comprising: a circuit board (1) having at least one large component part (2a) protruding therefrom mounted thereon; a casing (3) receiving the circuit board, the casing including at least one recess (11) configured to receive the large component part therein; and potting material (6) filled at least partly between the large component part and a surrounding wall of the recess. Typically, the potting material is filled in a gap between the large component part and the surrounding wall of the recess without substantially extending out of the recess.

If the large component part is supported solely by the circuit board via a soldering connection or the like, such a connection part is subjected to a significant stress when the large component part is subjected to external vibrations owing to inertia force acting thereon. However, according to the broad concept of the present invention, the large component part is additionally supported by the casing via the cured potting material, the stress acting on the connection part is minimized, and this enhances the mechanical integrity of the circuit board assembly. Because the use of the potting material is limited to the recess, the required amount of the potting material can be minimized, and this means a lower material cost and a reduced weight. Reducing the amount of the potting material means a shorter period of time required for curing it, and this improves the production efficiency of the circuit board assembly. If the protection of the component parts from intrusion of moisture is desired, protective coating may be additionally applied to the circuit board.

The recess is typically formed in a bottom wall of the casing, but may also be provided in a side wall or any other part of the casing without departing from the spirit of the invention as long as the recess at least partly surrounds or faces the large component part and defines a gap for filling the potting material.

According to a preferred embodiment of the present invention, the recess is defined as a shaped part of a bottom wall of the casing protruding from an outer surface of the bottom wall. According to another preferred embodiment of the present invention, the recess is defined by an upright wall extending from a wall of the casing and at least partly surrounding the large component part. In either case, the recess may not necessarily have a wall surrounding the large component part, but it may suffice if there is any part of the casing or component fixedly attached thereto that has a surface opposing any part of the large component part so that any part of the large component part away from the part thereof attached to the circuit board may be secured to the casing either directly or indirectly by using the potting material.

Such a protective structure for a circuit board can be fabricated by a method comprising: preparing a circuit board having at least one large component part protruding therefrom mounted thereon; preparing a casing configured to receive the circuit board therein and provided with a recess that at least partly receives the large component part therein; placing the circuit board in the casing and thereby causing the large component part to be received in the recess; pouring at least partly fluid potting material in a gap defined between the large component part and a surrounding wall surface of the recess; and allowing the potting material to be cured.

If desired, the circuit board may be mechanically fixed to the casing by using, for instance, threaded bolts, crimping pieces, press fitting, welding, soldering and/or bonding agents among other possibilities before pouring the potting material into the recess.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
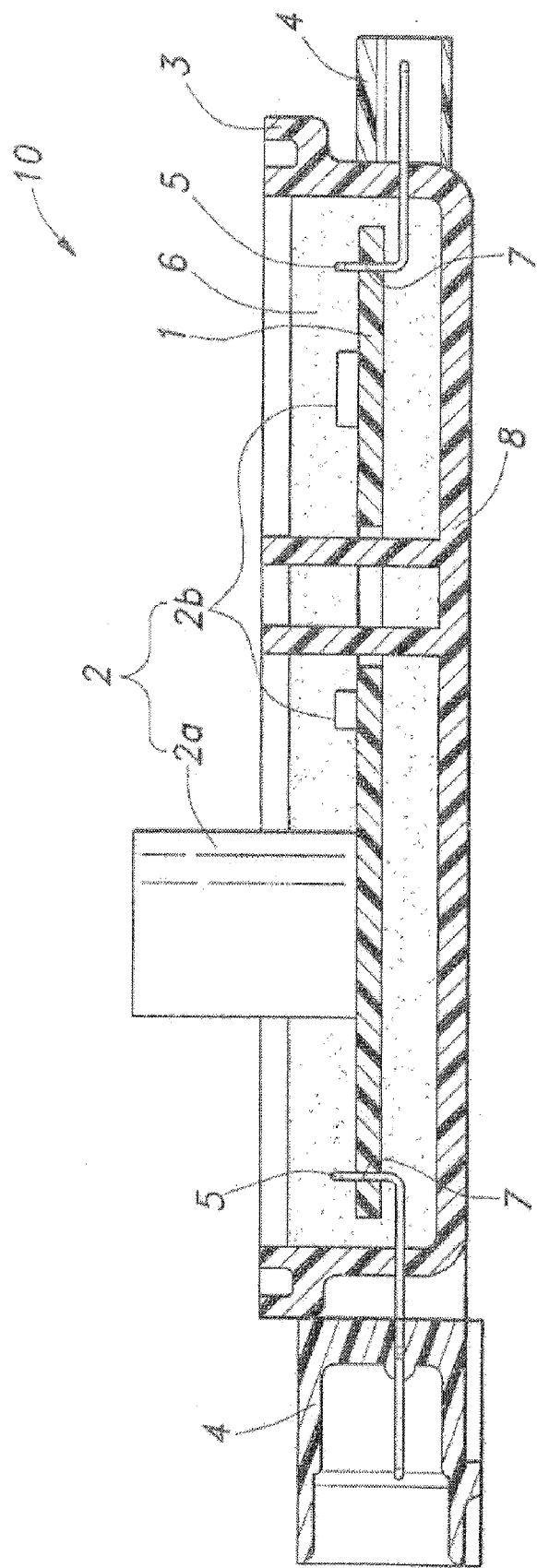
FIG. 1 is a sectional view showing a conventional ECU package.
Figure 2:
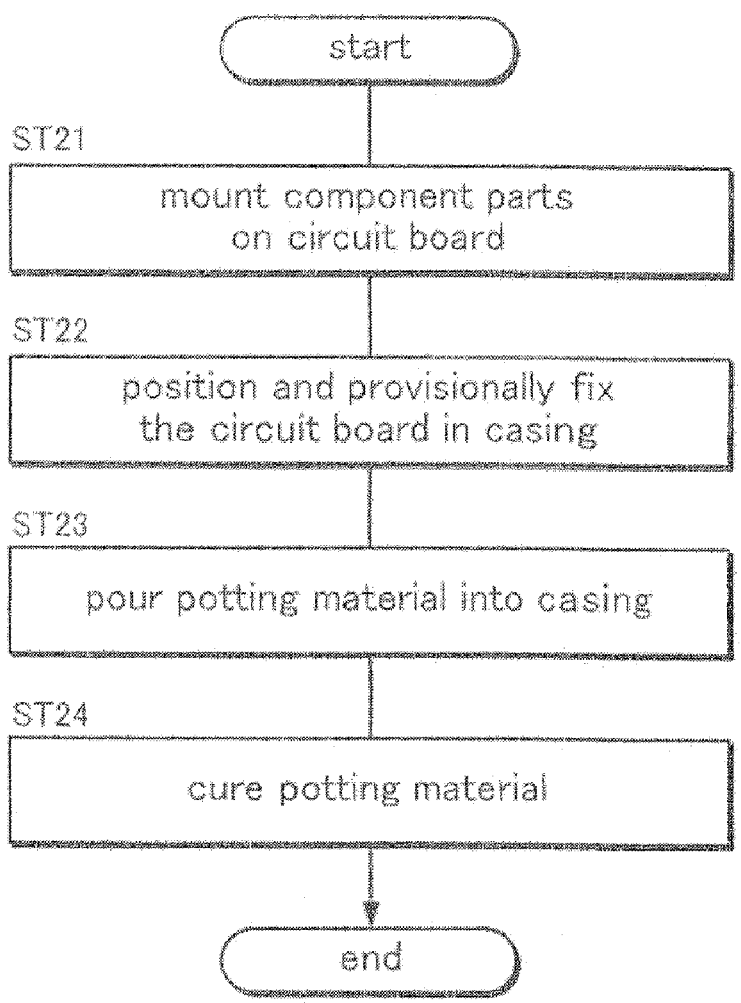
FIG. 2 is a flowchart showing the method for fabricating the conventional ECU package.
Figure 3:
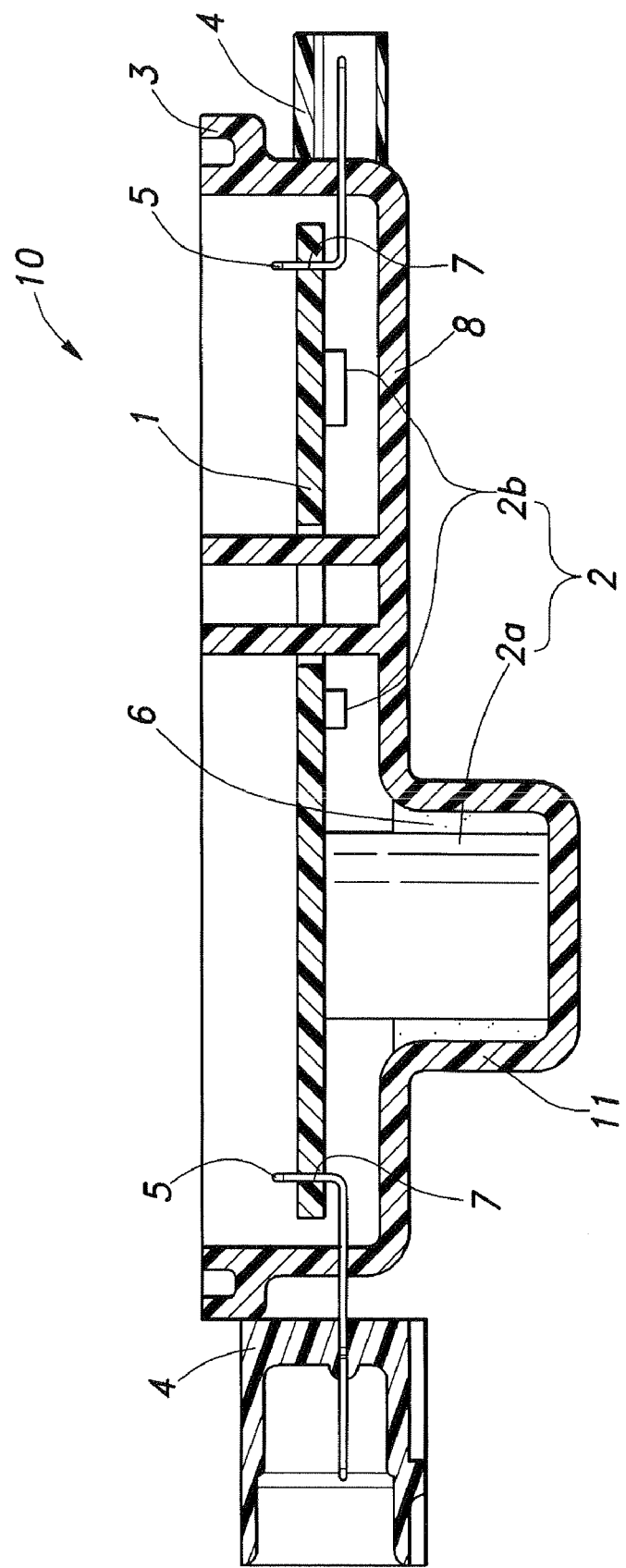
FIG. 3 is a sectional view showing a ECU package embodying the present invention.

FIG. 3 shows a ECU package embodying the present invention. In FIG. 3, the parts corresponding to the prior art illustrated in FIG. 1 are denoted with like numerals without repeating the description of such parts.

This ECU package 10 comprises a circuit board 1 and a plurality of electronic component parts 2 mounted on the circuit board 1. The electronic component parts 2 include at least one large electronic component part 2a which consists of a transformer in this case. The large electronic component part 2a as used herein means any component which has a relatively large mass and significantly protrudes from the circuit board 1, and may include any other large component parts such as electrolyte capacitors, chokes and variable resistors among other possibilities. The remaining electronic component parts consist of small electronic component parts 2b such as surface mounted component parts (which may consist of resistors and capacitors) and small discrete component parts.

The casing 3 defines an outer envelope of the ECU package 10, and may be made of plastic material (but may also be made of metallic material). The casing 3 may be generally rectangular in shape, and is provided with a generally flat bottom wall 8 and a peripheral upright wall. The casing 3 has an open top. The bottom wall 8 may be provided with ribs and/or projections protruding from the upper surface thereof (as seen in FIG. 3) in suitable parts thereof, and is additionally provided with a circular recess 11. The recess 11 defines a protrusion protruding from a bottom surface of the casing 3. A pair of connectors 4 also made of plastic material are integrally connected to the casing 3. A terminal 5 is insert molded in each connector 4 and adjoining part of the casing 3, and has an inner end bent into an upright orientation.

The circuit board 1 is received in the casing 3 with the surface thereof carrying the electronic component parts facing downwards or toward the bottom wall 8 of the casing 3, and the large electronic component 2a is received in the recess 11. In the illustrated embodiment, the bottom end of the large electronic component part 2a abuts the bottom surface of the recess 11. It is also possible that a small gap is defined between the bottom end of the large electronic component part 2a and bottom surface of the recess 11 without departing from the spirit of the present invention. The inner end of each terminal 5 is physically and electrically connected to a corresponding part of the circuit board 1. In other word, each terminal 5 has an additional function of fixedly holding the circuit board 1 in the casing 3.

Potting material 6 is poured into the recess 11, and at least partly fills the space between the electronic component part 2a and surrounding surface of the recess 11. Preferably, the potting material 6 does not substantially extend from the interior of the recess 11. If there is any gap between the electronic component part 2a and bottom surface of the recess 11, the potting material may also fill this gap. The potting material 6 may consist of insulating material such as silicone that cures at room temperature.

Figure 4:
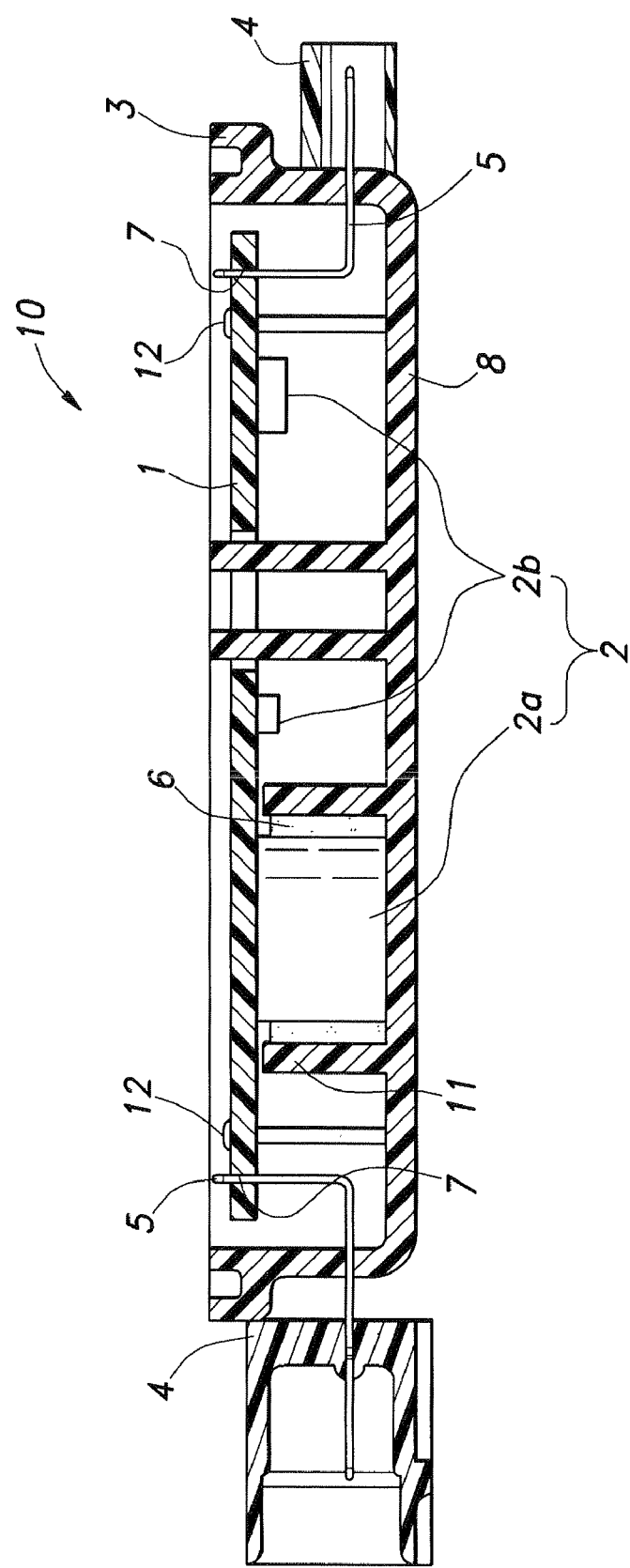
FIG. 4 is a view similar to FIG. 3 showing a second embodiment of the present invention.

FIG. 4 shows a second embodiment of the present invention. In FIG. 4, the parts corresponding to those of the first embodiment are denoted with like numerals without repeating the description of such parts.

Figure 5:
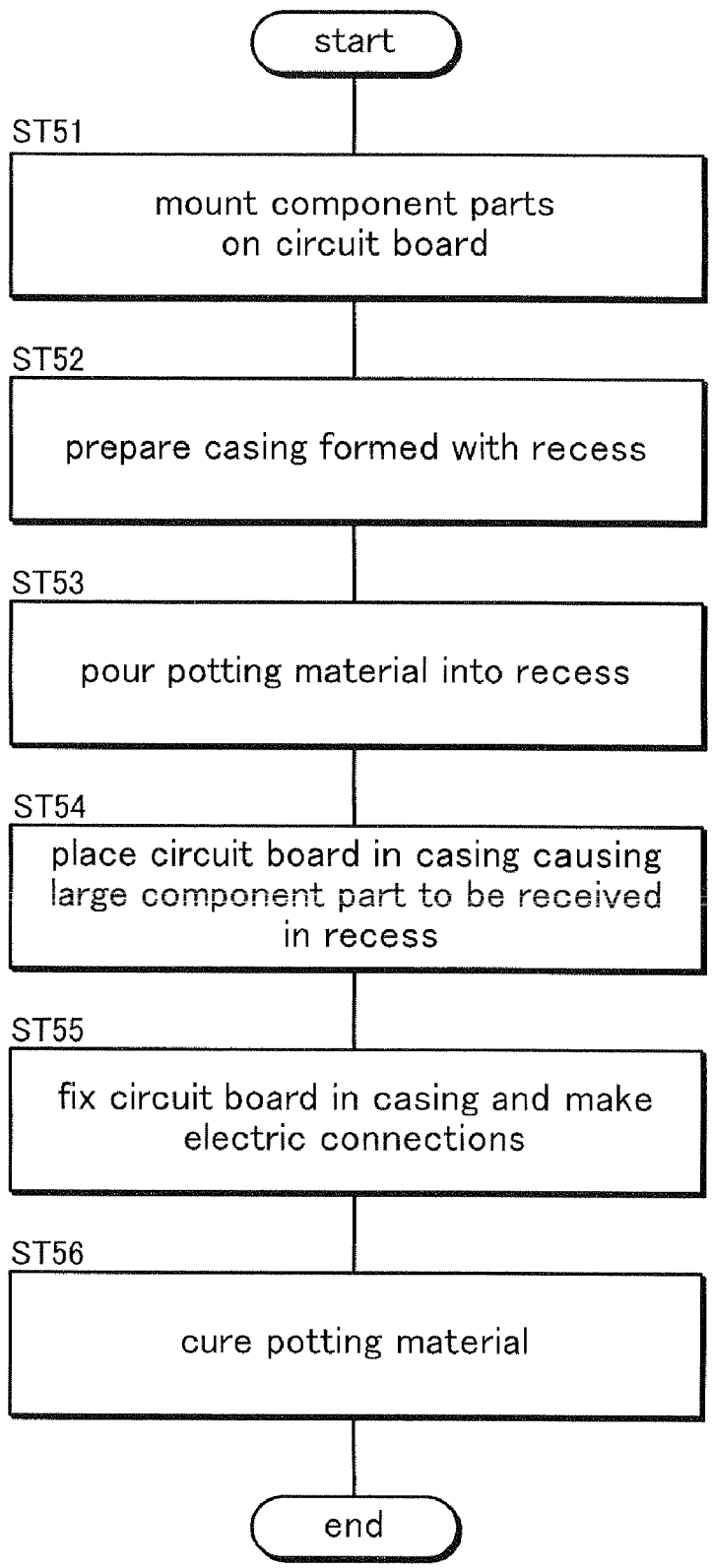
FIG. 5 is a flowchart showing the method of fabricating the ECU packages according to the present invention illustrated in FIGS. 3 and 4.

In this embodiment, a recess 11 for receiving a large electronic component 2a is defined by a tubular projection extending upward in FIG. 5 from the bottom wall 8. and the tubular projection is configured such as to closely surround the large electronic component 2a and define a small gap between them. However, it is also possible that an upright wall simply facing a side surface of the large electronic component 2a is used instead of the tubular projection. Again the lower end of the large electronic component 2a abuts the bottom surface of the recess 11 in the illustrated embodiment, but may also be slightly spaced away from the bottom surface of the recess 11. In this embodiment, the lower surface of the bottom wall 8 of the casing 3 is generally planar as opposed to the first embodiment.

In this embodiment, a plurality of threaded bolts 12 are used for firmly securing the circuit board 1 in the casing 3. However, such threaded bolts 12 are optional, and other securing means may also be used. It is also possible to do away with such threaded bolts or other securing means.

FIG. 5 is a flowchart showing a method for fabricating the ECU package according to the present invention. First of all, electronic component parts 2 are mounted on the circuit board 1 (ST51). Then, a casing 3 having a recess 11 in a bottom wall 8 thereof is prepared (ST52). The size and position of the recess 11 depend on the size of the large electronic component part 2a and position thereof. It is also possible to provide two or more recesses 11 to accommodate corresponding number of large electronic component parts 2a.

Potting material 6 is poured into the recess 11 (ST53), and in such an amount to be interposed at least partly between the large electronic component part and surrounding wall surface, and not to overflow from the recess 11 to any significant extent when the large component part 2a is finally placed in the recess 11 as will be described hereinafter.

Before the potting material becomes cured or loses fluidity, the circuit board 1 is placed in the casing 3 thereby causing the large electronic component part 2a to be received in the corresponding recess 11 (ST54). If desired, the potting material 6 may have such a consistency at this stage so that the circuit board 1 may be kept immobile in position during the subsequent handling of the assembly (without using additional means for fixing the circuit board in position). The base ends of the terminals 5 are soldered to the corresponding parts (holes 7) of the circuit board 1 (ST55), and, when applicable, other securing means such as threaded bolts are fastened. When the curing of the potting material 6 is complete, the fabrication process of the ECU package 10 is complete (ST56).

The greater the mass of the large electronic component part 2a is, and the greater the protrusion of the large electronic component part 2a from the circuit board 1 is, the greater the influence of external vibrations on the part connecting the large electronic component part 2a becomes. Therefore, by fixedly securing the large electronic component part 2a to the casing 3, relative displacement between the large electronic component part 2a and circuit board 1 is minimized, and this minimizes the adverse influences of external vibrations on the part connecting the large electronic component part 2a to the circuit board 1.

As compared to the prior art illustrated in FIG. 1 in which the potting material fills a substantial part of the space within the casing 3, the illustrated embodiments require a relatively small amount of potting material because the potting material is required to fill only a small space that exists between the large electronic component part 2a and the surrounding surface of the recess 11. Therefore, the required amount of potting material is minimized, and this minimizes the weight of the package and material cost. Also, using a small amount of potting material means that a shorter period of time is required for curing the potting material, and this improves the work efficiency in fabricating the ECU package.

If any protection from moisture is required for the circuit board 1, it can be readily accomplished by applying coating material to the entire surface or a selected surface area of the circuit board.

Although the present invention has been described in terms of a preferred embodiment thereof, it is obvious to a person skilled in the art that various alterations and modifications are possible without departing from the scope of the present invention which is set forth in the appended claims. For instance, the application of the present invention is not limited to ECU packages but is applicable to any electronic packages.

The contents of the original Japanese patent application on which the Paris Convention priority claim is made for the present application are incorporated in this application by reference.

The invention claimed is:

1. A protective structure for a circuit board, comprising:
   a circuit board having at least one large component part mounted on and extending away from a lower surface of the circuit board;
   a casing receiving the circuit board, the casing including at least one recess configured to receive the large component part therein and which defines a surface encompassing the large component part; and
   potting material filled at least partly between and contacting the large component part and the surface of the recess which encompasses the large component part without the potting material extending out of the recess.

2. The protective structure for a circuit board according to claim 1, wherein the recess is defined as a shaped part of a bottom wall of the casing protruding from an outer surface of the bottom wall.

3. The protective structure for a circuit board according to claim 1, wherein the recess is defined by an upright wall extending from a wall of the casing and at least partly surrounding the large component part.

4. The protective structure for a circuit board according to claim 1, wherein the large component part extends toward a bottom wall of the casing.

5. The protective structure for a circuit board according to claim 4, wherein a bottom wall of the large component part either directly abuts the bottom wall of the casing or directly opposes the bottom wall of the casing across a space defined therebetween.

* * * * *